US006411644B1

(12) United States Patent
Myer

(10) Patent No.: US 6,411,644 B1
(45) Date of Patent: Jun. 25, 2002

(54) FREQUENCY HOP PILOT TECHNIQUE FOR A CONTROL SYSTEM THAT REDUCES DISTORTION PRODUCED BY ELECTRICAL CIRCUITS

(75) Inventor: Robert Evan Myer, Denville, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/162,753

(22) Filed: Sep. 29, 1998

(51) Int. Cl.[7] .................. H04B 15/00; H04K 1/00; H04L 27/30
(52) U.S. Cl. ............... 375/132; 375/254; 375/278; 375/296
(58) Field of Search ............... 375/254, 270, 375/132, 278, 296; 330/52; 702/124, 190, 191; 455/67.1, 67.4, 67.3

(56) References Cited

U.S. PATENT DOCUMENTS 5,166,634 A * 11/1992 Narahashi et al. .......... 330/151
6,041,083 A * 3/2000 Larsson et al. ............. 375/304

* cited by examiner

Primary Examiner—Mohammad H. Ghayour
(74) Attorney, Agent, or Firm—The Law Office of John Ligon

(57) ABSTRACT

A control system comprising an electrical circuit that produces distortion where the electrical circuit has a frequency band of operation. A pilot modulated carrier signal is frequency hopped about the frequency band of operation. The hopping pilot modulated carrier signal does not interfere with any signal applied to or generated by the electrical circuit as it is not at any time located within the frequency band of operation. Information obtained from the hopping pilot modulated carrier is provided to the control system which uses such information to cancel the distortion produced by the electrical circuit.

4 Claims, 3 Drawing Sheets

FREQUENCY HOP PILOT TECHNIQUE FOR A CONTROL SYSTEM THAT REDUCES DISTORTION PRODUCED BY ELECTRICAL CIRCUITS

BACKGROUND OF THE INVENTION

1. Field of the Invention

The present invention is directed to a control system comprising an electrical circuit that uses a pilot signal to substantially cancel distortion produced by the electrical circuit and more particularly to a technique of frequency hopping about the frequency band of operation of the electrical circuit.

2. Description of the Related Art

Electrical signals when applied to electrical circuits are often distorted as a result of being processed by the circuits. Also electrical circuits generate signals for various useful purposes. The distortion comprises any undesired signals produced by the electrical circuits which are added to or are somehow combined with the applied or generated signals. A well known technique for substantially canceling distortion produced by an electrical circuit uses a control system coupled to the electrical circuit to which a pilot signal is applied. The applied pilot signal is detected by the control system. The applied pilot signal can have a single spectral component (i.e., one frequency) of a certain amplitude or the applied pilot signal can comprise a plurality of spectral components of various amplitudes. Typically, the applied pilot signal has an amplitude that is at least 60 dB lower than signals applied to or generated by the electrical circuit. The control system obtains information (about the distortion) from the detected pilot signal and uses that information to substantially cancel the distortion produced by the electrical circuit.

A control system comprises at least one circuit which uses external signals or signals generated by the at least one circuit to process signals applied to the at least one circuit. A particular implementation of the technique discussed above is shown in FIG. 1. FIG. 1 depicts a control system, comprising two feed forward loops (loop 1 and loop 2) and detection circuit 132. A pilot signal is applied to electrical circuit 108 via coupler 105. Electrical circuit 108 can be any electrical and/or electronic (e.g., Radio Frequency (RF) linear amplifier, power amplifier) circuit. Loop 1 comprises coupler 105, Gain & Phase circuit 104, splitter 102 and delay circuit 126. Coupler 105 is typically a device which combines two or more input signals and allows access to all or a portion of the combined signal. A coupler is also used to obtain a portion of a signal appearing at its input and output. Gain & Phase circuit 104 is typically a circuit which modifies the amplitude and phase of signals applied to its input based on the values of control signals applied to its control inputs (not shown). Splitter 102 is a circuit with one input and at least two outputs where a signal applied to the input is substantially replicated at the outputs. Delay circuit 126 is typically a circuit which applies a certain amount of delay to a signal applied to its input.

When a signal is applied to the input of the control system (i.e., to splitter 102), the distortion experienced by the applied signal due to electrical circuit 108 is isolated at point A (i.e., path 123). In particular, an input signal is applied to splitter 102. Splitter 102 substantially replicates the input signal on paths 103 and 127. In path 103 the input signal is applied to Gain & Phase circuit 104, coupler 105 and electrical circuit 108. In path 127, the input signal is delayed by delay circuit 126 and then fed to cancellation circuit 124 via path 125. Although not shown, it will be readily understood to those skilled in the art that the amplitude and phase of the input signal on path 125 can be detected (using well known detection circuitry) and converted to control signals that are applied to the control inputs (not shown) of Gain and Phase circuit 104. Using coupler 112, a portion of the input signal (plus any distortion produced by electrical circuit 108) appearing at the output of electrical circuit 108 is fed to cancellation circuit 124 via path 113. Cancellation circuit 124 can be implemented as a combiner circuit which has at least two inputs and one output. A combiner circuit combines signals applied to its inputs and transfers the combined signal to its output. Gain and Phase circuit 104 is adjusted such that the amplitude and phase of the input signal on path 113 are modified resulting in that signal being substantially 180° out of phase (+/−1°) and relatively the same amplitude (i.e., substantially the inverse) with the input signal on path 125 such that when the two signals are combined by cancellation circuit 124 they substantially cancel each other leaving the distortion (produced by electrical circuit 108) at point A (path 123). Thus Loop 1 is designed to isolate the distortion produced by electrical circuit 108.

Loop 2, which comprises delay circuit 114, coupler 116, Gain & Phase circuit 122, and amplifier 120, is designed to use information obtained by Detection circuit 132 from a pilot signal applied to electrical circuit 108 to substantially cancel the distortion produced by electrical circuit 108. In particular, a pilot signal is applied to electrical circuit 108 via coupler 105. The pilot signal (processed by electrical circuit 108) appears on path 115 and at the output of coupler 116, i.e., on path 117. The pilot signal also appears at point A on path 123 after having propagated through path 113 via coupler 112. A portion of the pilot signal processed by electrical circuit 108 is fed to detection circuit 132 via coupler 130 and path 128. Detection circuit 132 comprises well known circuits (e.g., Log detector/amplifier, Sample & Hold circuit, Null circuit) to detect signal characteristics (e.g., amplitude, spectral content, phase response) of the pilot signal. Some or all of the characteristics may have been altered due to the distortion effects of electrical circuit 108. Detection circuit 132 detects the characteristics of the input and uses this information to generate control signals on path 131 to cause Gain & Phase circuit 122 to modify the pilot signal. The pilot signal at point A is modified such that the pilot signal appearing on path 118 is substantially the inverse (relatively same amplitude, 180° out of phase, +/−1°) of the pilot signal appearing on path 115. Amplifier 120 provides additional gain to the output of Gain & Phase circuit 122. The additional gain is calculated such that the signal appearing on path 118 has an amplitude substantially equal to the amplitude of the signal on path 115. Delay circuit 114 is designed such that the two pilot signals arrive at coupler 116 at substantially the same moment; that is, the two pilot signals are substantially synchronized (aligned in time) to each other. When the two pilot signals are combined by coupler 116 they cancel each other.

Detection circuit 132 now has the information that allows Gain & Phase circuit 122 to modify distortion appearing at point A and thus cancel distortion appearing at the output of electrical circuit 108. When an input signal is applied to the control system, any distortion produced by electrical circuit 108 is isolated at point A (on path 123) as discussed above. The signal on path 115 is the input signal (processed by electrical circuit 108) plus any distortion produced by electrical circuit 108. The distortion at point A is modified by Gain and Phase circuit 122 based on the information (i.e., signal characteristics) obtained from the previously applied pilot signal so that the distortion on path 129 is substantially the inverse of the distortion on path 115. The distortions on path 115 and path 118 are combined at coupler 116 causing the distortions to substantially cancel each other resulting in an output signal that is substantially free of distortion.

Electrical circuit 108 has a bandwidth that defines a frequency band of operation. It is desirable that the pilot signal be spectrally located substantially in the middle of the frequency band of operation of electrical circuit 108 because the distortion experienced by such a pilot signal tends to be substantially similar to the distortion experienced by a signal applied to or generated by electrical circuit 108. However, placing the pilot signal anywhere in the band of operation of electrical circuit 108 causes interference to occur between the input signal and the pilot signal adding more distortion to the input signal. The interference is any interaction between the pilot signal and an applied or generated signal that adversely affects one or more characteristic (e.g., amplitude, frequency, phase) of the applied or generated signal and/or the pilot signal. Thus, interference not only distorts any signal that is applied or generated by the electrical circuit, but also affects the pilot signal. As discussed above, the pilot signal is typically 1/1000 th the amplitude of applied or generated signals and thus would be interfered with by such signals. A distorted pilot signal provides inaccurate information about the distortion and thus the very purpose of such a pilot signal is defeated. Also, even when the pilot signal is located in the middle of the frequency band of operation, it does not experience the distortions located in other parts (e.g., lower band or upper band) of the frequency band of operation. What is therefore needed is to use a pilot signal that obtains information about the entire frequency band of operation of the electrical circuit and does so without interfering with any signals applied to or generated by the electrical circuit.

SUMMARY OF THE INVENTION

The present invention is a control system comprising an electrical circuit that produces distortion where the electrical circuit has a frequency band of operation. A carrier signal modulated by a pilot signal is applied to the electrical circuit and is frequency hopped about the frequency band of operation of the electrical circuit. After the pilot modulated carrier signal has frequency hopped at least once about the frequency band of operation of the electrical circuit, information about the distortion produced by the electrical circuit is obtained from the pilot signal. There is no interference between the frequency hopped pilot modulated carrier signal and any signal applied to or generated within the band of operation of the electrical circuit because the pilot modulated carrier signal is not hopped within the frequency band of operation of the electrical circuit. The information obtained is used by the control system to substantially cancel the distortion produced by the electrical circuit.

The control system of the present invention also comprises a first feed forward loop and a second feed forward loop coupled to the electrical circuit. The control system of the present invention further comprises a carrier circuit coupled to a Single Side Band (SSB) modulator which is coupled to the electrical circuit. The control system of the present invention still further comprises a detection circuit coupled to the carrier circuit and the second feed forward loop. The carrier circuit is configured to generate a frequency hopped carrier signal. The SSB modulator is configured to generate a single side band pilot signal and to modulate the carrier with the single side band pilot. The carrier circuit is further configured to cause the pilot modulated carrier signal to frequency hopped about the frequency band of operation of the electrical circuit and thus not interfere with any signal applied to or generated within the frequency band of operation of the electrical circuit. After at least one hop, as the pilot modulated carrier signal hops about the frequency band of operation of the electrical circuit, the detection circuit obtains information about the distortion produced by the electrical circuit and provides the information to the second feed forward loop. The first feed forward loop is configured to isolate the distortion produced by the electrical circuit. The second feed forward loop is configured to use the information obtained by the Detection circuit to substantially cancel the distortion produced by the electrical circuit.

DETAILED DESCRIPTION

Figure 1:
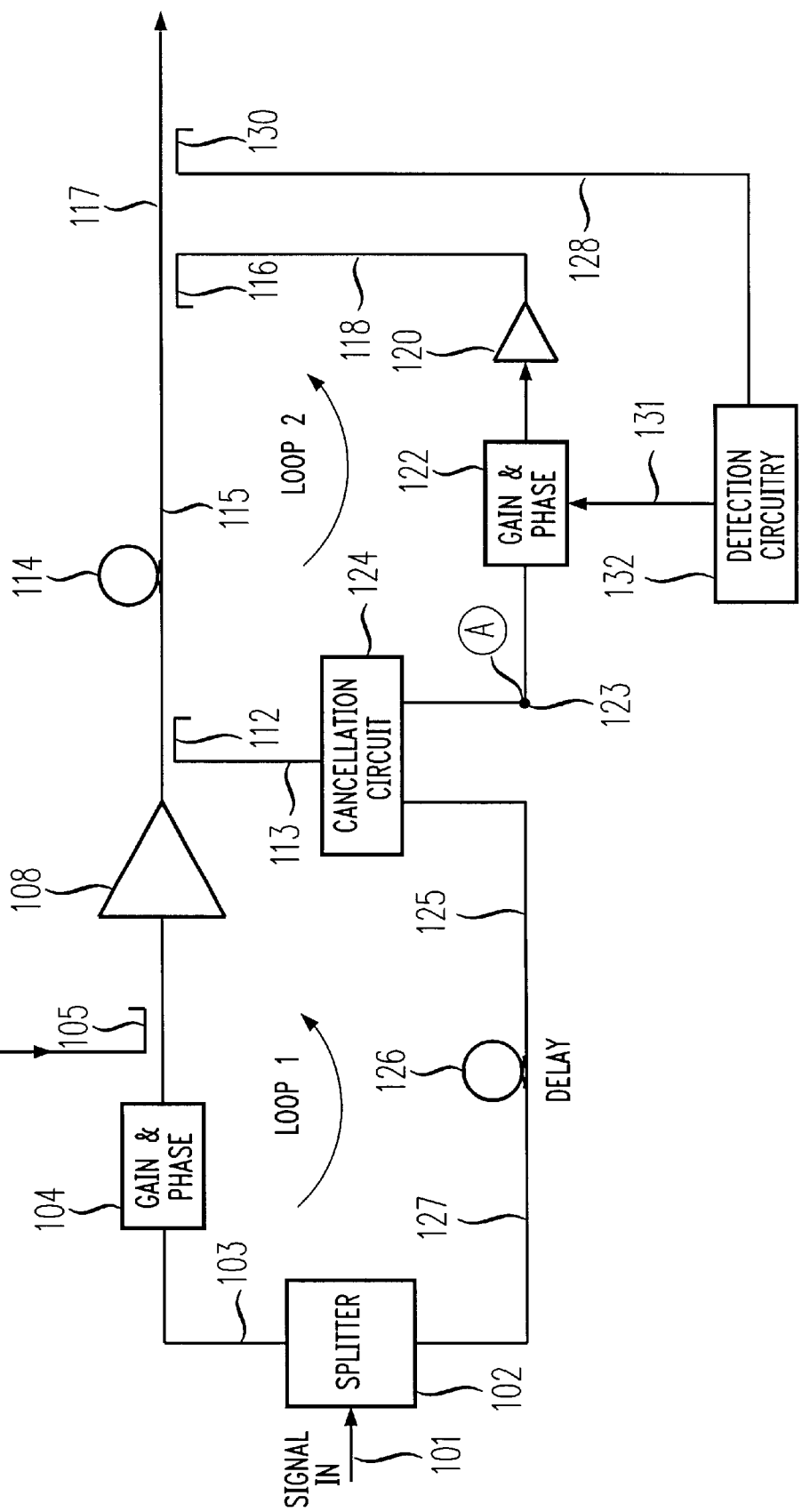
FIG. 1 depicts a control system comprising two feed forward loops and detection circuitry.
Figure 2:
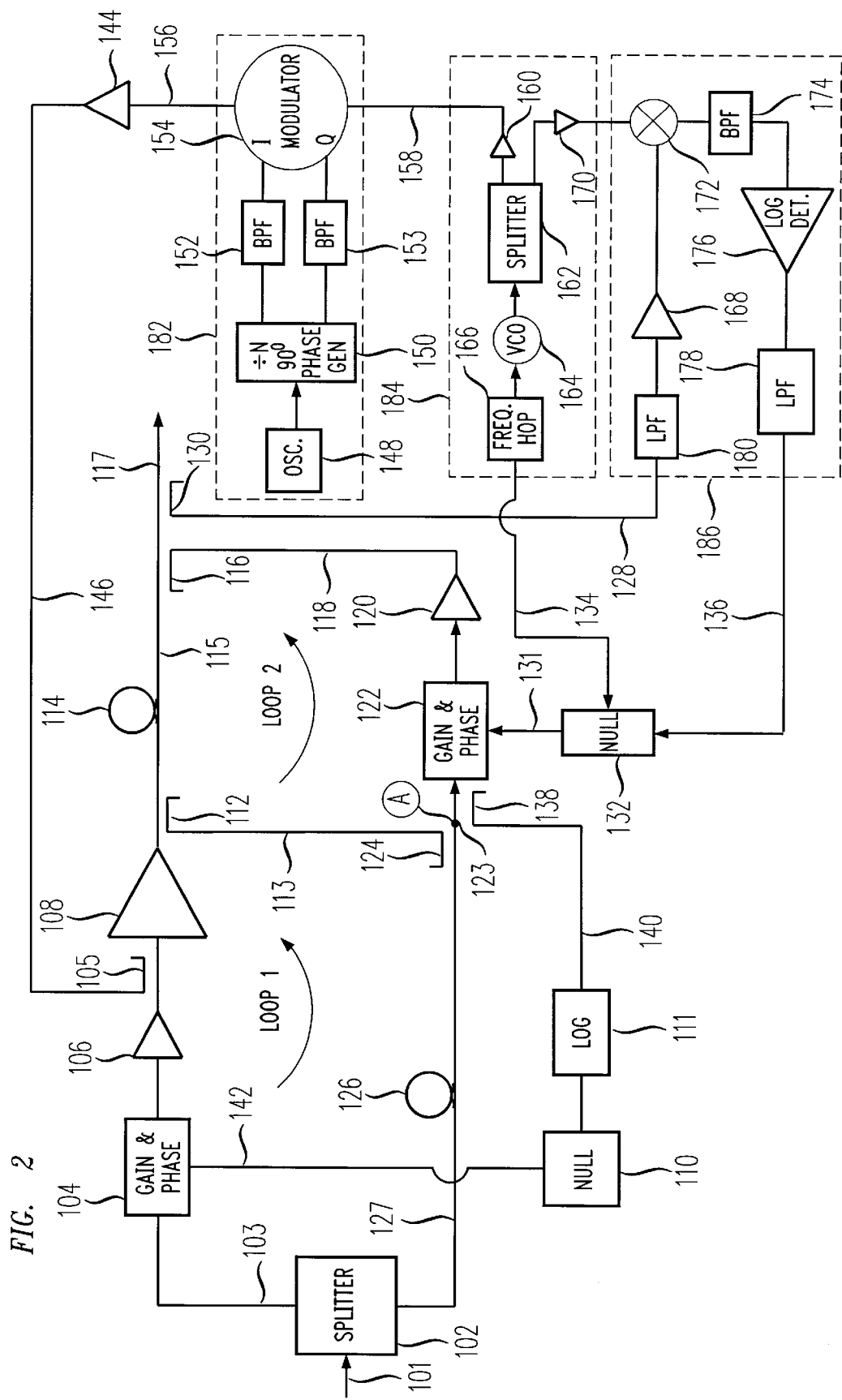
FIG. 2 depicts a control system of the present invention.

Referring to FIG. 2, there is shown a control system of the present invention comprising electrical circuit 108 coupled to a first feed forward loop (i.e., loop 1) and a second feed forward loop (i.e., loop 2). The control system of the present invention further comprises carrier circuit 184 coupled to Single Side Band (SSB) modulator 182 and to Detection circuit 186. Electrical circuit 108 produces distortion which is isolated at point A by loop 1. Loop 2 uses information obtained from detection circuit 186 to cancel the distortion produced by electrical circuit 108.

The information obtained by detection circuit 186 is gleaned from a pilot modulated carrier signal applied to electrical circuit 108 (via path 146 and coupler 105) with the use of carrier circuit 184 and Single Side Band modulator 182. Carrier circuit 184 and SSB modulator 182 cause the pilot modulated carrier signal to frequency hop about the frequency band of operation of electrical circuit 108. The frequency hopping of the pilot modulated carrier signal is the generation of a signal so that, at different instants the signal is spectrally located below and above the frequency band of operation of electrical circuit 108; the pilot modulated carrier signal is not at any time located within the frequency band of operation of the electrical circuit. Therefore, there is no interference between the hopping pilot modulated carrier and any signal applied to or generated by electrical circuit 108. After the pilot modulated carrier signal has frequency hopped at least once about the frequency band of operation of electrical circuit 108, Detection circuit 186 obtains information from the pilot signal and provides that information to Null circuit 132 via path 136. Null circuit 132 generates control signals that cause Gain & Phase circuit 122 to modify the distortion at point A such that the distortion is cancelled with distortion on path 115 by coupler 116.

Figure 3:
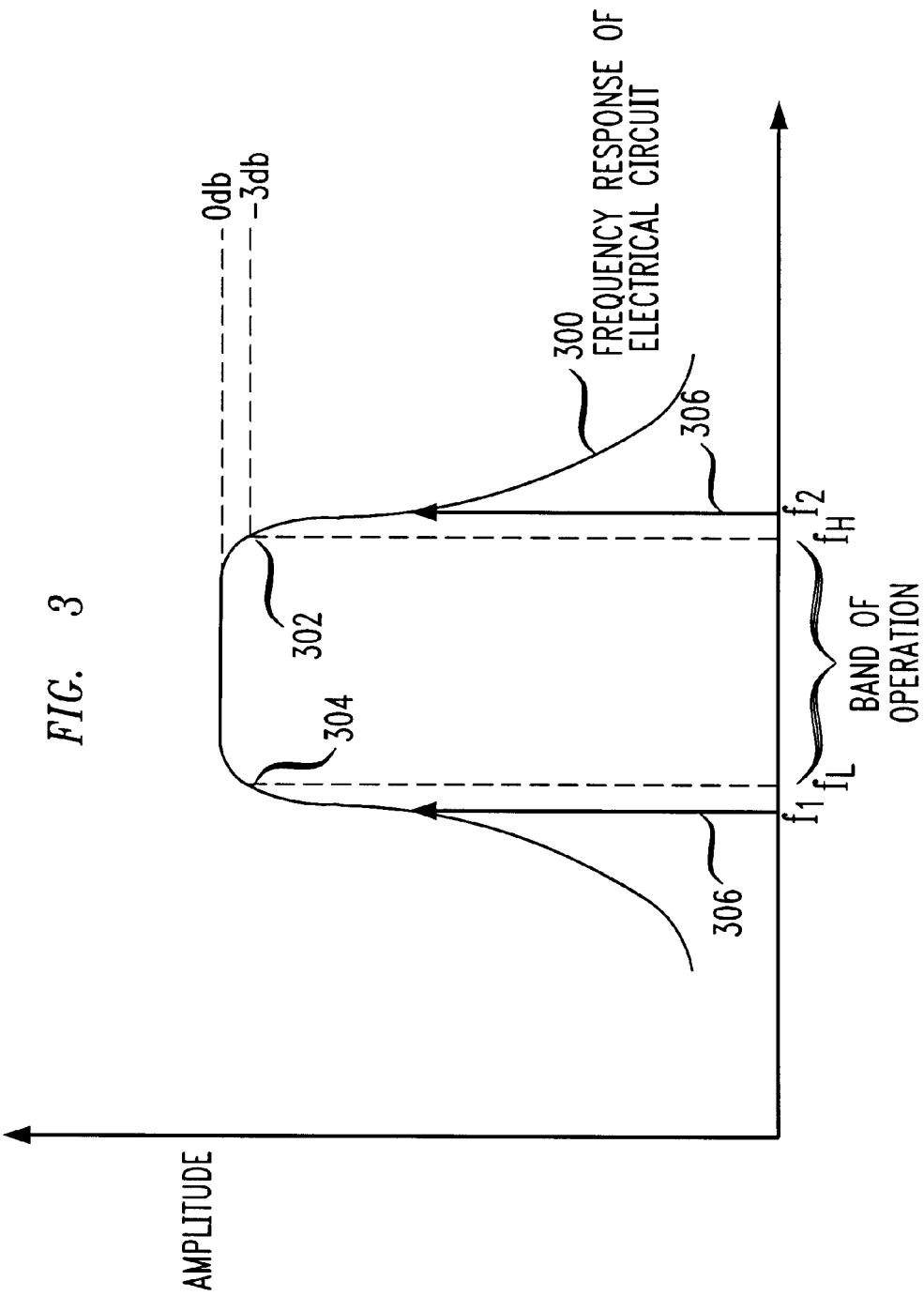
FIG. 3 depicts the frequency response of the electrical circuit of the control system of the present invention showing a pilot modulated carrier signals at the hopping frequencies.

Referring to FIG. 3, there is shown a frequency response (300) of electrical circuit 108 with a spectral components 306 representing the pilot modulated carrier signal. The frequency response is a chart or graph showing how a particular characteristic (e.g., amplitude, phase) of an electrical circuit corresponds with frequency. It should be noted that the particular frequency response shown is for illustrative purposes only and that electrical circuit 108 is not limited to frequency response 300. The frequency band of operation is a range of frequencies within which electrical circuit 108 processes and/or generates signals. The boundaries of the frequency band of operation are defined by lower frequency $f_L$ and upper frequency $f_U$. Frequencies $f_L$ and $f_U$ correspond to the points (302, 304) at which the frequency response is 3 dB below its maximum amplitude response (0 dB). Typically the bandwidth of a circuit is defined by the frequencies that correspond to its 3 dB points. The frequency band of operation need not be the bandwidth. One frequency hop is defined as when pilot modulated carrier signal 306 initially starts at a location ($f_1$) below the frequency band of operation and then hops to location $f_2$ above the frequency band of operation. The term frequency hopping is a well known term and is generally related to generating one or a plurality of signals at various frequency locations at different times. Depending on the proximity of frequencies ($f_1$, $f_2$), i.e., the hopping frequencies, to frequencies $f_L$ and $f_U$ the average of the information obtained from the hopping pilot modulated carrier signal reasonably reflects the distortion within the band of operation.

Referring again to FIG. 2, Carrier circuit 184 comprises Frequency Hop generator 166 coupled to Voltage Controlled Oscillator (VCO) 164 which is coupled to Splitter 162. Each of the outputs of Splitter 162 is coupled to an amplifier (160, 170). One of the outputs is applied to Mixer 172 of Detection circuit 186 and the other output is applied to SSB modulator 182. Frequency Hop Generator 166 produces a switching voltage signal. VCO 164 generates a carrier (i.e., a sinusoid) whose frequency is varied in direct correspondence to the switching voltage. As the voltage generated by Frequency Hop Generator 166 switches from one value to another, the frequency of the carrier changes from one frequency to another. Thus, the Carrier circuit 184 generates a carrier signal that switches between a first frequency ($f_1$) and a second frequency ($f_2$).

SSB modulator 182 is a well known circuit shown here comprising Oscillator 148, 90° Phase circuit 150, Band pass Filters (BPF) 152, 153 and balanced modulator 154. Oscillator 148 generates a pilot signal (e.g. a square wave) of a certain frequency that is applied to 90° Phase circuit 150. 90° Phase circuit 150 divides the frequency of the square wave and generates two square waves having that same desired frequency but which are 90° out of phase with each other. Each of the signals is applied to a Band pass filter (152, 153) having a pass band that allow certain frequency components of the signals to pass through their circuitry virtually unaffected. Band pass filters 152 and 153 are well known filter circuits that allow signals that fall within their pass band to pass through virtually unaffected and filter out (or significantly attenuate) signals having frequencies that fall outside of their pass bands. It is well known that a square wave comprises many frequency components. The square wave generated by Oscillator 148 is converted to a sinusoid by BPF 152 and 153 because many of the frequency components of the square wave are filtered out by BPF 152 and 153. The pass band is a frequency (or group of frequencies) about which the Band pass filter frequency response is tuned. The outputs of the Band pass filters 152 and 153 are applied to balanced modulator 154. The output of Carrier circuit 184 is also applied to balanced modulator 154 (via path 158). Balanced modulator uses the pilot signal to modulate the carrier signal. Typically, when a carrier signal is modulated, other signals having frequencies commonly referred to as side band frequencies are created as a result of the modulation. The side band frequencies are frequencies that are higher and lower than the frequency of the carrier by an equal amount. Because of the 90° phase relationship between the pilot signals applied to balanced modulator 154, one of the side bands of the resulting pilot modulated carrier signal is effectively suppressed. The output of SSB modulator 182 is the carrier signal shifted in frequency by an amount equal to the frequency of the pilot signal, and thus the output is a pilot modulated carrier signal.

The pilot modulated carrier signal is applied to electrical circuit 108 and appears on path 117. A portion of the pilot modulated carrier signal is coupled to path 128 via coupler 130. The pilot modulated carrier signal is applied to Band Stop Filter (BSF) 180. BSF 180 is a filter circuit that rejects or significantly attenuates signals having certain frequencies and does not affect all other signals. BSF 180 is designed to reject any signal falling within the band of operation of electrical circuit 108. The pilot modulated carrier signal is then applied to Mixer 172 via amplifier 168. An output of carrier circuit 184 is also applied to Mixer 172. Mixer 172 is a well known circuit having at least two inputs and at least one output where the output is the result of the two input signals being multiplied to each other. It is well known that when two signals having certain frequencies are mixed, the result are signals comprising frequencies which are the sum and difference of the frequencies of the two signals. The mixing of two signals having the same frequencies is known as synchronous detection. Therefore, the pilot modulated carrier signal is synchronously detected by Mixer 172 and the output of Mixer 172 is fed to BPF 174 whose center frequency is equal to the frequency of the pilot signal. The output of BPF 174 is therefore the pilot signal.

The pilot signal is applied to Log Detector 176 which detects a characteristic (e.g., amplitude) of the pilot signal and converts said characteristic to a voltage. The output of Log Detector 176 is applied to Low Pass Filter (LPF) 178. LPF 180 acts as an averaging circuit and generates an average of a characteristic (e.g., amplitude, phase, frequency) of the detected pilot signal which contains information about the distortion experienced by the pilot signal. The average is applied to Null circuit 132 via path 136. Upon reception of a control signal from Frequency Hop Generator 166 (via path 134) Null circuit 132 generates a control signal to Gain & Phase circuit 122 via path 131. Frequency Hop Generator 166 can send such a control signal after at least one hop or after a plurality of hops about the frequency band of electrical circuit 108. Frequency Hop generator 166 is also configured to control the length of time the pilot modulated carrier signal stays at a particular hopping frequency. The rate of hopping and the length of time of each hop is such that Carrier Detection circuit 186 is able to provide information to Null circuit 132. The control signals generated by Null circuit 132 cause Gain & Phase amplifier 122 to modify the distortion at point A such that it is canceled wit distortion appearing on path 115 with the use of coupler 116.

I claim:

1. In a control system coupled to an electrical circuit that produces distortion where the electrical circuit has a frequency band of operation and where a pilot signal is applied to and operated on by the control system to substantially cancel the distortion, a method for providing the pilot signal comprising the steps of:

alternately generating a first and a second carrier frequency, wherein said first carrier frequency is above and said second carrier frequency is below the frequency band of operation of the electrical circuit; and causing the pilot signal to be modulated onto said alternately generated carrier signals.

2. The method for providing the pilot signal of claim 1 wherein the step of causing the pilot signal to be modulated is implemented by a Single Side Band modulator configured to generate the pilot modulated carier signal.

3. The method for providing the pilot signal of claim 1 wherein a Detection circuit is coupled to the control system and configured to obtain information from the pilot modulated carrier signal without any interference between a signal applied to or generated by the electrical circuit and the modulated carrier signal.

4. The method for providing the pilot signal of claim 1 wherein the step of alternately generating a first and a second carrier signal is implemented by a frequency hop generator coupled to a voltage controlled oscillator which is coupled to a Splitter.

* * * * *